United States Patent [19]

Krumrein

[11] 4,160,235

[45] Jul. 3, 1979

[54] PULSE GENERATOR

[75] Inventor: Gerhard Krumrein, Neuenstadt, Fed. Rep. of Germany

[73] Assignee: Licentia Patent-Verwaltungs-G.m.b.H., Frankfurt am Main, Fed. Rep. of Germany

[21] Appl. No.: 841,312

[22] Filed: Oct. 11, 1977

[30] Foreign Application Priority Data

Oct. 21, 1976 [DE] Fed. Rep. of Germany ....... 2647569

[51] Int. Cl.$^2$ .................. B60Q 1/46; H03B 3/282; H03K 1/08
[52] U.S. Cl. .................. 340/81 R; 340/641; 307/271; 315/200 A
[58] Field of Search .................. 340/81 R, 81 F, 251; 307/271, 360; 315/77, 88, 200 A

[56] References Cited

U.S. PATENT DOCUMENTS

| | | | |
|---|---|---|---|
| 3,735,196 | 5/1973 | Bolinger et al. | 340/81 R X |
| 3,973,238 | 8/1976 | Kato et al. | 340/81 R |
| 4,052,626 | 10/1977 | Tuma et al. | 307/271 |

*Primary Examiner*—Donald J. Yusko
*Attorney, Agent, or Firm*—Spencer & Kaye

[57] ABSTRACT

A pulse generator comprises a comparator to the inputs of which are connected a capacitor chargeable by a power source and a voltage divider respectively, two transistors being connected to the output of the comparator, one to set the voltage ratio of the voltage divider and one to provide a discharge path for the capacitor and two additional transistors being selectively connected to the comparator output, one providing a different voltage ratio of the voltage divider and the other providing an independent discharge path for the capacitor.

5 Claims, 3 Drawing Figures

PULSE GENERATOR

BACKGROUND OF THE INVENTION

The invention relates to a pulse generator with a switchable output frequency and a selectable clock pulse ratio with the different output frequencies from a comparator, a voltage divider being connected to its input as well as a capacitor which is chargeable by the supply voltage, whereby an output signal dependent on the ratio of the input voltages arises at the output of the comparator, as well as having two transistors connected to the output of the comparator, whereby the divider ratio of the voltage divider is adjusted so as to determine the frequency via one transistor, while the other represents a discharge current path for the capacitor.

Pulse generating circuits are already known in which two voltages are compared in a comparator. One of the two input voltages constantly changes until it reaches the value of the other fixed input voltage and thus brings about a change in the output signal from the comparator.

SUMMARY OF THE INVENTION

It is an object of the invention to provide a circuit for a pulse generator with the aid of which pulses with a switchable frequency and with a freely selectable clock pulse ratio may be produced at the output of the comparator.

According to the invention, there is provided a pulse generator comprising a comparator, a voltage divider connected to a first input of said comparator, a capacitor chargeable by a supply voltage and connected to a second input of said comparator, a first transistor connected to the output of said comparator for adjusting the voltage ratio of said voltage divider to determine the output frequency of said output, a second transistor connected to said output for forming a discharge current path for said capacitor, a third transistor for varying the voltage ratio of said voltage divider, a fourth transistor for providing a second discharge current path for said capacitor and switch means for selectively connecting said third and fourth transistors to said output of said comparator.

Further according to the invention, there is provided a pulse generator with a switchable output frequency and a selectable clock pulse ratio for the different output frequencies from a comparator, to the input of which is connected a voltage divider and a capacitor which is chargeable by the supply voltage, whereby an output signal dependent on the ratio of the input voltages arises at the output of the comparator, as well as having two transistors connected at the output of the comparator, whereby the voltage ratio of the voltage divider is adjusted by one transistor so as to determine the frequency, while the other transistor forms a discharge current path for the capacitor, characterized in that at least two further transistors are connectible to the output of the comparator via a switch whereby the divider ratio of the voltage divider may be set by one transistor so as to change the frequency, while the other transistor path represents a further discharge current path for the capacitor which is independent of the first discharge current path.

BRIEF DESCRIPTION OF THE DRAWINGS

The invention will now be described in greater detail, by way of example, with reference to the drawings, in which.

DESCRIPTION OF THE PREFERRED EMBODIMENTS

In a preferred embodiment of the invention, in a pulse generator of the type described at the outset, at least two further transistors are connectible to the output of the comparator via a switch, whereby the divider ratio of the voltage divider may be set in a manner changing the frequency via one transistor, while the other transistor path represents a further discharge current path for the capacitor.

Thus, with a closed switch, the base electrodes of four transistors are connected to the output of the comparator, whereby a decoupling resistor is preferably arranged between the base electrode of each transistor and the connection to the comparator output. The transistors changing the divider ratio of the voltage divider have collector resistances which are connected in parallel with a resistor of the voltage divider via the transistor acting respectively as a switch. The two current branches from the collector emitter path of the transistors and the respective collector resistance are thus connected in parallel with one resistor of the voltage divider.

At least one of the transistors representing the discharge current paths for the capacitor has a collector resistance determining the discharge time constant and thus the clock pulse ratio. Obviously there is also the possibility of connecting a variable or fixed resistor in both current paths. The circuit in accordance with the invention may be used particularly well as a control circuit for the flashers of a motor vehicle. The flash frequency is then changed in a desirable manner by the circuit in accordance with the invention in the case of failure of the load while simultaneously changing the clock pulse ratio. All of the circuit members, with the exception of the capacitor and the charging resistor, may be integrated into a common semiconductor body. The comparator is preferably formed by a differential amplifier of conventional type.

With the pulse generator in accordance with the invention, it is also advantageous if the circuit has a self-starter with defined starting characteristics. Furthermore, the circuit only requires one capacitor. For both frequencies which may be produced at the output of the comparator, the clock pulse ratio may be freely selected independently of the other frequency by dimensioning the divider resistances and the resistances in the discharge current paths.

Figure 1:
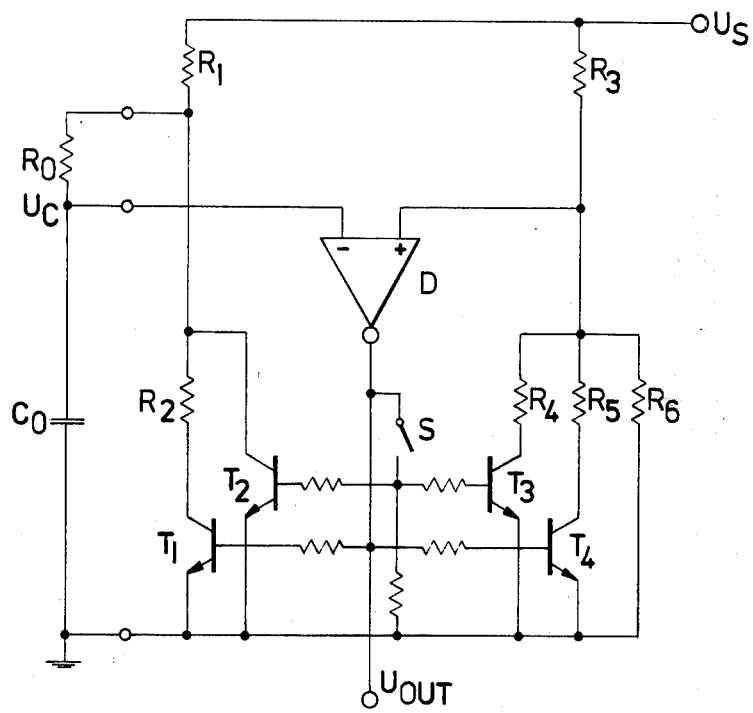
FIG. 1 is a circuit diagram of one embodiment of the invention.

Referring now to the drawings, FIG. 1 shows the circuit in accordance with the invention. Two current branches are connected in parallel to each other between the two poles of the supply voltage $U_S$. One current branch contains a voltage divider made up of resistors $R_3$ and $R_6$. The other current branch is formed by the series connection of impedances $R_1$, $R_0$ and $C_0$, whereby, at the same time, this is the charging current path for the capacitor $C_0$. The capacitor voltage $U_C$ forms one input magnitude of the comparator D. The other input magnitude of the comparator is derived at the voltage divider and in fact at the connection between the resistors $R_3$ and $R_6$. Two current branches are connected in parallel to the resistor $R_6$ of the voltage divider and these comprise the collector-emitter path of the transistors $T_3$ or $T_4$ respectively and the related collector resistor $R_4$ or $R_5$. Two further current branches are connected in parallel with the series connection of resistor $R_0$ and capacitor $C_0$. One current branch comprises the collector-emitter path of the transistor $T_2$, while the other current branch comprises the collector-emitter path of the transistor $T_1$ and the related collector resistor $R_2$. The base electrodes of transistors $T_1$ and $T_4$ are connected to the output of the comparator via decoupling resistors. The base electrodes of the transistors $T_2$ and $T_3$ may also be connected to the output of the comparator D via a switch S and appropriate decoupling resistors.

The circuit described and shown in FIG. 1 operates as follows:

After applying the supply voltage $U_S$, the capacitor $C_0$ is charged up via $R_1$ and $R_0$. The waveform of the capacitor voltage $U_C$ is shown graphically in FIG. 2. The voltage $U_2$ across resistor $R_6$ is determined by the divider ratio between the resistors $R_3$ and $R_6$. The voltage $U_C$ and the voltage $U_2$ form the input magnitudes of the comparator, the comparator preferably comprising a differential amplifier. During the time $t_1$, in which the capacitor voltage $U_C$ has not yet reached the value $U_2$, there is a low potential applied to the output U out of the comparator in accordance with FIG. 3. Initially it is assumed that the switch S is closed so that all base electrodes of the transistors $T_1$ to $T_4$ are connected to the output of the comparator via decoupling resistors. Since there is a low potential applied to the output of the comparator all of the transistors remain blocked.

The charging time constant of the capacitor is dependent on the resistors $R_0$ and $R_1$ and on the capacitance of the capacitor $C_0$. If $R_0$ is very much greater than $R_1$ then the dependence of the charging time constant on resistor $R_1$ may be neglected. If $U_C$ reaches the value $U_2$ and thus both input magnitudes at the comparator have the same value then the comparator switches over and in accordance with FIG. 3 there is a high potential at the output of the comparator. As a result of the potential increase at the output of the comparator, all of the transistors $T_1$ to $T_4$ are through connected. This means that the resistors $R_4$ and $R_5$ are connected in parallel to the resistor $R_6$ and thus the input potential passed to the comparator and taken off the voltage divider drops to the value $U_1$. The current conducting saturated transistor $T_2$ discharges the capacitor $C_0$ via $R_0$ until the capacitor voltage reaches the lower threshold value $U_1$. This discharge time which is determined substantially by the resistance value of $R_0$ and the capacitance $C_0$ is designated $t_2$ in FIG. 2. During this time the high output potential remains at the output of the comparator. The discharge current path also connected up across the transistor $T_1$ and the resistor $R_2$ may be neglected when the switch S is closed because of the semiconductor resistance present. If the capacitor voltage $U_C$ has reached the value $U_1$ then low potential sets in again at the comparator output whereby all the transistors are blocked again and the capacitor $C_0$ is charged up to the value $U_2$ again in the time $t_3$. The time ratio $t_3/t_2$ determines the clock pulse ratio of the frequency $f_1$.

Figure 3:
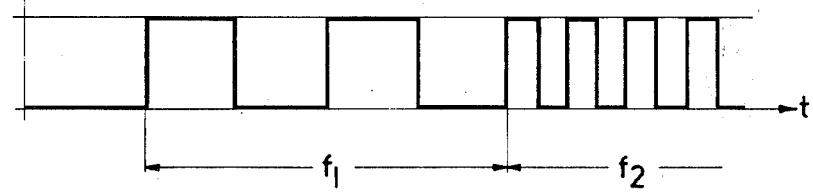
FIG. 3 is a graph showing the waveform of the output voltage of the embodiment of FIG. 1.

In accordance with FIG. 3 the fairly large frequency $f_2$ at the output of the comparator D is set by opening the switch S. With an open switch S the voltage value $U_2$, up to which the capacitor may be charged, remains unchanged since it is predetermined by the divider ratio of resistors $R_3$ and $R_6$. If the capacitor voltage $U_C$ reaches the value $U_2$ then the high potential sets in again at the comparator output as a result of which however, only transistors $T_4$ and $T_1$ are triggered. As a result, only the resistor $R_5$ is connected in parallel to the resistor $R_6$ and the potential $U_3$ derived at the voltage divider is at the comparator input, said potential $U_3$ being substantially above the potential $U_1$. The capacitor $C_0$ may be discharged therefore only up to the value $U_3$. The discharge current path of the capacitor $C_0$ now must pass through the collector resistor $R_2$ of the transistor $T_1$ via the resistor $R_0$ and via the through connected collector-emitter path of this transistor $T_1$. The collector resistor $R_2$ permits a maximum theoretical discharge of the capacitor at the value $U_4$, which is below the value $U_3$ however and therefore cannot be reached. The resistance values $R_0$ and $R_2$ together with the capacitance magnitude determine the discharge time constant $t_4$ for the capacitor $C_0$, which is independent of the discharge time constant at the frequency $f_1$.

Figure 2:
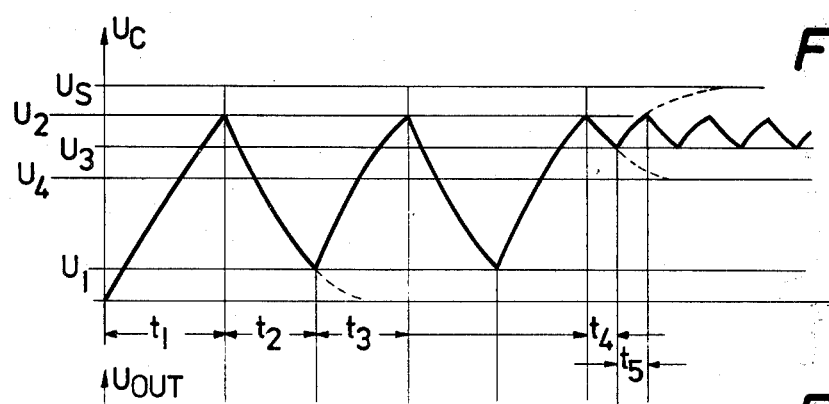
FIG. 2 is a graph showing the waveform of the voltage across the capacitor in the embodiment of FIG. 1.

The voltage curve at the capacitor $C_0$ is again shown graphically with the open switch S in FIG. 2. From the ratio between the discharge time $t_4$ and the charge time $t_5$ is given the clock pulse ratio of the output pulse of the frequency $f_2$ in accordance with FIG. 3. Thus it is ensured that the clock pulse ratio of the frequency $f_2$ is independent of the clock pulse ratio of the frequency $f_1$.

In the following an example of the circuit constants in accordance with the invention is given which is particularly suitable when using the circuit for a flasher unit of a motor vehicle. The stated frequency $f_1$ indicates a functioning display with its loads intact, while the frequency $f_2$ appears if at least one of the loads has failed. As a result of this marked frequency change, for example it is a question of almost three times the frequency, failure of a load is clearly indicated.

| Examples of dimensioning: | | |
|---|---|---|
| $R_1$ = 5.5k Ohm | $C_0$ = 3.3uF | |
| $R_2$ = 6.5k Ohm | Decoupling resistors for | |
| $R_3$ = 4k Ohm | $T_1$-$T_4$ = 11k Ohm | |
| $R_4$ = 1.6k Ohm | | |
| $R_5$ = 24k Ohm | Derived (leakage)) resistor | |
| $R_6$ = 12k Ohm | at S = 51k OHM | |
| $U_S$ = 10V | $t_1$ = 0.44s | $f_1$ = 1.47Hz |
| $U_2$ = 7.5V | $t_2$ = 0.33s | $f_2$ = 4.08Hz |
| $U_3$ = 6.67V | $t_3$ = 0.35s | |
| $U_4$ = 5.32V | $t_4$ = 0.153s | |
| $U_1$ = 2.5V | $t_5$ = 0.092s | |

It will be understood that the above description of the present invention is susceptible to various modification changes and adaptations.

What is claimed is:

1. A pulse generator with a switchable output frequency and a selectable clock pulse ratio in the different output frequencies from a comparator, to the input of which is connected a voltage divider and a capacitor which is chargeable by the supply voltage, whereby an output signal dependent on the ratio of the input voltages arises at the output of the comparator, as well as having two transistors connected at the output of the comparator, whereby the voltage ratio of the voltage divider is adjusted by one transistor so as to determine the frequency, while the other transistor forms a discharge current path for the capacitor, characterized in that at least two further transistors are connectible to the output of the comparator via a switch whereby the divider ratio of the voltage divider may be set by one transistor so as to change the frequency, while the other transistor path represents a further discharge current path for the capacitor.

2. A pulse generator as defined in claim 1, wherein the base electrodes of the said two transistors are connected to the output of the comparator, while the base electrodes of said additional transistors are connectible to the output of the comparator via a switch.

3. A pulse generator as defined in claim 1, wherein the two transistors changing the divider ratio of said voltage divider have collector resistors and two current branches made up of the collector-emitter path of the said two transistors with their collector resistors are connected in parallel with one resistor of said voltage divider.

4. A pulse generator as defined in claim 1, and comprising a collector resistor for at least one of the transistors forming the discharge current paths for the capacitor determining the discharge time constant and thus the clock pulse ratio.

5. A pulse generator comprising a comparator, a voltage divider connected to a first input of said comparator, a capacitor chargeable by a supply voltage and connected to a second input of said comparator, a first transistor connected to the output of said comparator for adjusting the voltage ratio of said voltage divider to determine the output frequency of said output, a second transistor connected to said output for forming a discharge current path for said capacitor, a third transistor for varying the voltage ratio of voltage divider, a fourth transistor for providing a second discharge current path for said capacitor and switch means for selectively connecting said third and fourth transistors to said output of said comparator.

* * * * *